United States Patent
Altrichter et al.

(10) Patent No.: US 6,727,721 B2
(45) Date of Patent: Apr. 27, 2004

(54) METHOD FOR SWITCHING FROM A FIRST OPERATING CONDITION OF AN INTEGRATED CIRCUIT TO A SECOND OPERATING CONDITION OF THE INTEGRATED CIRCUIT

(75) Inventors: Hans Altrichter, Villach (AT); Dieter Draxelmayr, Villach (AT); Mario Motz, Wernberg (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/195,570

(22) Filed: Jul. 12, 2002

(65) Prior Publication Data

US 2003/0011409 A1 Jan. 16, 2003

(30) Foreign Application Priority Data

Jul. 13, 2001 (DE) .......................................... 101 34 215

(51) Int. Cl.$^7$ ............................................. G01R 31/02
(52) U.S. Cl. ........................ 324/763; 324/628; 324/613; 324/603
(58) Field of Search ................................ 324/763, 764, 324/765, 158.1, 76.16, 76.48, 76.62, 759, 628, 603, 613, 602, 620, 420, 415; 338/78; 455/1, 67.1, 67.4; 327/384

(56) References Cited

U.S. PATENT DOCUMENTS 5,790,046 A 8/1998 Blossfeld 6,262,871 B1 * 7/2001 Nemir et al. ................. 361/42
6,549,019 B2 * 4/2003 Nielsen ....................... 324/628

FOREIGN PATENT DOCUMENTS

| DE | 44 22 867 | 1/1996 |
| DE | 195 38 858 | 4/1997 |
| DE | 101 17 382 | 10/2002 |
| DE | 101 17 383 | 10/2002 |
| DE | 101 17 384 | 10/2002 |

* cited by examiner

*Primary Examiner*—Kamand Cuneo
*Assistant Examiner*—Trung Nguyen
(74) *Attorney, Agent, or Firm*—Schiff Hardin LLP

(57) ABSTRACT

The invention provides a method for switching from a first operating condition of an integrated circuit to a second operating condition of the integrated circuit differing from the first operating condition. To that end, the output signal generated at a circuit output is externally overwritten. The inventive method or the inventive integrated circuit have the advantage that the switching from one operating condition into another operating condition of the integrated circuit can be implemented in a very simple way but with a high immunity to interference. The switching can be very easily initiated as needed because the only thing needed is the application of a voltage level—which is already available in the system—to an output of the integrated circuit. Furthermore, the selection of a circuit output assures that there is a high certainty that the switching condition will not accidentally occur because this is largely precluded by the standard and usually prescribed external interconnection of a circuit output.

13 Claims, 2 Drawing Sheets

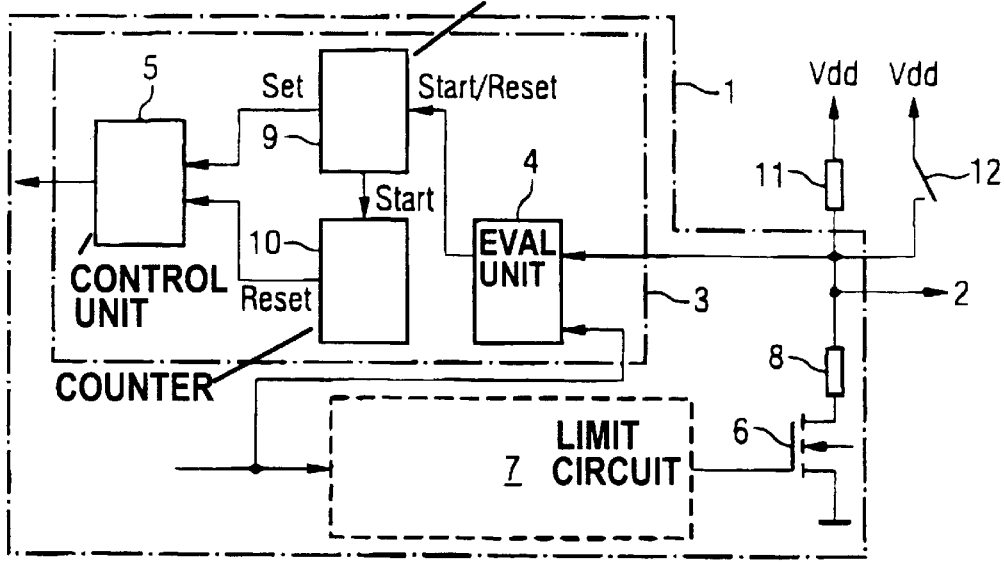
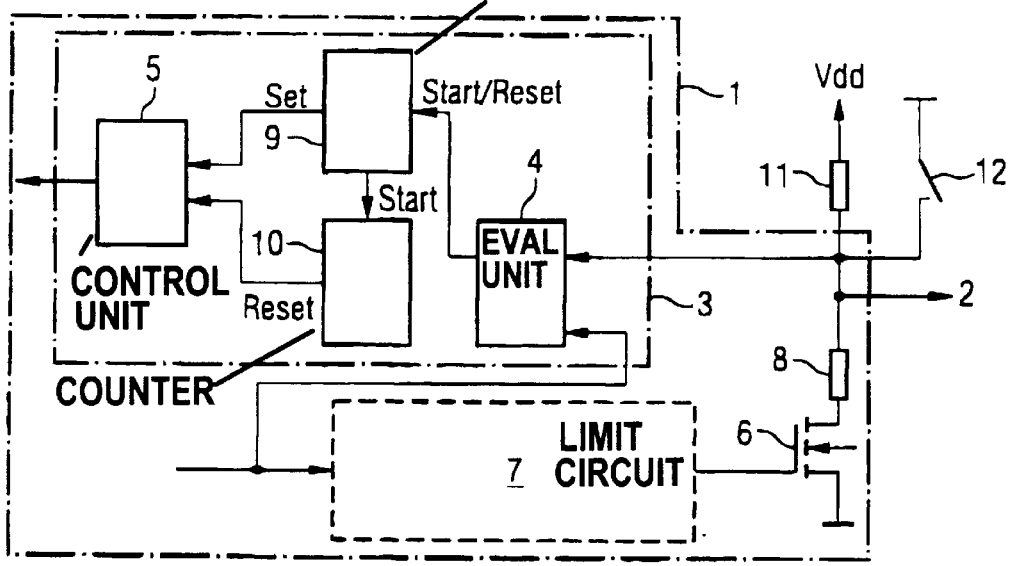

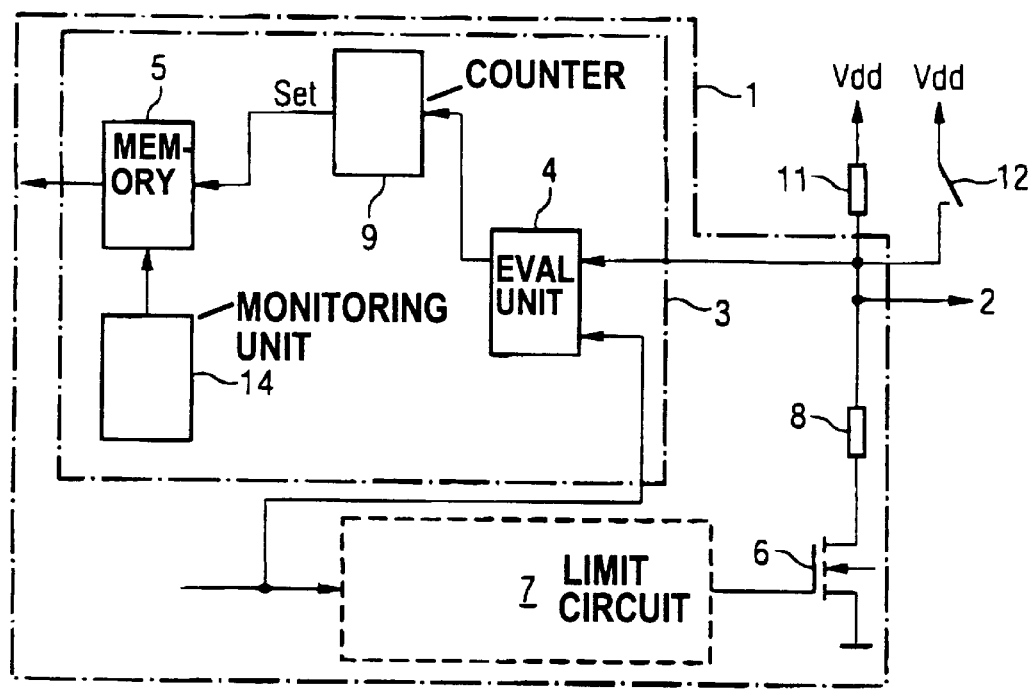

METHOD FOR SWITCHING FROM A FIRST OPERATING CONDITION OF AN INTEGRATED CIRCUIT TO A SECOND OPERATING CONDITION OF THE INTEGRATED CIRCUIT

BACKGROUND OF THE INVENTION

1. Field of the Invention

The present invention is directed to a method for switching from a first operating condition of an integrated circuit to a second operating condition of the integrated circuit differing from the first operating condition, particularly with respect to an integrated sensor.

2. Description of the Related Art

Many integrated circuits implement a specific operating condition/behavior (a "test mode") for better testability; this behavior allows conclusions to be made about functions of the circuit that are difficult to measure from the outside. In order to avoid using a separate signal input for the transmission of the test mode information, but while managing with existing terminals already occupied with functions, a way must be found to make a specific signal or a combination of a plurality of signals available to the integrated circuit such that they differ from those of the normal operating case.

A functionally simple solution for distinguishing between normal and test mode is to apply a maximum voltage that is usually forbidden in the normal operating case to a circuit input and to internally recognize this voltage level with a comparator. However, this solution is disadvantageous in that the full range of voltage cannot be made available for operation; furthermore, the comparator consumes power.

Another possibility for distinguishing between normal and test mode involves transmitting the information by modulating the voltage at a circuit input and internally evaluating this modulation with a suitable circuit. The realization and communication of this protocol, however, requires greater outlay, and also requires additional power consumption.

SUMMARY OF THE INVENTION

The present invention is therefore based on the object of offering a method for switching between two different operating conditions of an integrated circuit that largely reduces or avoids these difficulties.

This object is achieved by the method and appertaining apparatus for switching from a first operating condition of an integrated circuit to a second operating condition of the integrated circuit differing from the first operating condition as described below. Further advantageous embodiments, developments and aspects of the present invention are also provided.

Inventively, a method for switching from a first operating condition of an integrated circuit to a second operating condition of the integrated circuit differing from the first operating condition is provided in which the integrated circuit generates a prescribed output voltage as an output signal at least in the first operating condition and at least one circuit output. The inventive method comprises the steps:

a) the integrated circuit is placed into the first operating condition;

b) the circuit output is externally charged with a voltage that differs from the prescribed output voltage;

c) the voltage present at the circuit output is evaluated; and d) the integrated circuit is placed into the second operating condition dependent on the evaluation in step c).

This object is also achieved by an integrated circuit having a circuit arrangement for switching from a first operating condition of the integrated circuit to a second operating condition of the integrated circuit differing from the first operating condition. This integrated circuit generates a prescribed output voltage as an output signal at least in a first operating condition and at least one circuit output, and the circuit arrangement for the switching comprises at least one evaluation unit that is connected to the circuit output of the integrated circuit and comprises at least one control unit that is connected to the evaluation unit and generates at least one control signal dependent on the result of the evaluation unit such that the integrated circuit switches from the first operating condition into the second operating condition.

The inventive method and/or the inventive integrated circuit have the advantage that the switching from one operating condition into another operating condition of the integrated circuit can be implemented in a very simple way but with a high immunity to interference. As needed, the switching can be very easily initiated because the only thing needed for this is the application of a voltage level that is already available in the system to an output of the integrated circuit. Furthermore, the selection of a circuit output assures with a high certainty that the switching condition will not accidentally occur, since this is largely precluded by the usual, external interconnection of a circuit output. At the same time, the evaluation of the voltage adjacent at the circuit output can be implemented with a relatively simple circuit-oriented mechanism and can be implemented in a largely low-power or power-free manner.

According to a preferred embodiment of the inventive method, the prescribed output voltage corresponds to a logical value and the voltage externally applied to the circuit output corresponds to the logical value complementary to said logical value. This embodiment has the advantage that the evaluation of the voltage adjacent at the circuit output can be implemented nearly power-free with especially simple evaluation units, particularly logical operations. It is particularly preferred when the logical value that corresponds to the voltage adjacent at the circuit output is logically operated with the logical value that corresponds to the prescribed output voltage using an XOR operation or using a NOR operation.

According to another preferred embodiment of the inventive method, the integrated circuit is placed into the second operating condition when the voltage adjacent at the circuit output does not coincide with the prescribed output voltage over a prescribed time span. This prescribed time span has the function of internally declaring the switching valid only after this condition has existed for a certain length of time, which further enhances the immunity to interference.

According to another preferred embodiment of the inventive method, the integrated circuit is placed back into the first operating condition when at least one prescribed criterion is met. For example, the integrated circuit can be reset after a predetermined time following the beginning of the second operating condition. This resetting after the expiration of a predetermined time interval, however, is only one of many possibilities for the resetting. For example, the integrated circuit can also be in turn reset after a renewed application of the operating voltage. Further possibilities may include introducing a separate reset command or utilizing other, inherently forbidden over-voltages and under-voltages. Instead of being placed into the first operating condition given the presence of a prescribed criterion, the integrated circuit can also be placed into a further (third, fourth, etc.) operating condition.

According to a preferred embodiment of the inventive integrated circuit, the evaluation unit comprises at least one logic circuit, particularly an AND or a NOR circuit. It is especially preferred when the evaluation unit comprises simple AND or NOR gates.

According to another preferred embodiment of the inventive integrated circuit, the control unit comprises a memory. After a positive result of the evaluation, the evaluation unit can store this condition in the memory until the memory is reset due to the presence of a further criterion and, thus, the integrated circuit is placed back into the first operating condition (or into some other operating condition).

According to another preferred embodiment of the inventive integrated circuit, the circuit arrangement for the switching comprises at least one time-counter unit. Such a time-counter unit can assist in implementing a prescribed time span over which the voltage at the circuit output must not coincide with the prescribed output voltage so that a switching can ensue.

According to another preferred embodiment of the inventive integrated circuit, the circuit arrangement for switching comprises at least one monitoring unit. The monitoring unit serves the purpose of checking the at least one criterion on the basis of which a decision is made as to whether the integrated circuit is reset into the first operating condition.

DESCRIPTION OF THE DRAWINGS

The invention is presented in greater detail below on the basis of the following Figures.

FIG. 1 is a block circuit diagram of a first embodiment of the inventive integrated circuit;

FIG. 2 is a block circuit diagram of a second embodiment of the inventive integrated circuit; and FIG. 3 is a block circuit diagram of a further embodiment of the inventive integrated circuit.

DETAILED DESCRIPTION OF THE INVENTION

First Embodiment

FIG. 1 shows a first embodiment of the inventive integrated circuit 1. This integrated circuit can fulfill a number of functions. In the present example, the integrated circuit corresponds to an integrated sensor, for example, an integrated magnetic field sensor as disclosed in German patent applications 101 17 382.2, 101 17 383.0 or 101 17 384.9, whose contents are herewith incorporated by reference. Such an integrated sensor usually has at least three essential operating conditions. On the one hand, this is a type of "raw condition" in which the sensor can still be configured. In this condition, the sensor can already work normally but the sensor can be switched from operating condition into a further, second operating condition.

This second operating condition makes it possible to load specific parameter sets and to observe specific internal events. The operator of the sensor can thus optimally adapt the sensor to the respective measurement task and permanently program the optimum operating parameters. Furthermore, a third operating condition is provided that essentially corresponds to the first operating condition with the exception that one can no longer proceed from the third operating condition into the second operating condition. The integrated sensor is thus blocked to prevent an inadvertent reprogramming.

The inventive integrated circuit 1 comprises a circuit output 2 at which a prescribed output voltage is generated as an output signal in a first operating condition. This can be achieved, for example, in that a specific output voltage is fundamentally present at the circuit output in this first operating condition or in that the circuit output, as during a normal measurement mode, outputs a voltage that corresponds to a measurement. In order to assure in this second case that a prescribed output voltage is output, the sensor can be subject, for example, to a corresponding measuring environment, for example a prescribed magnetic field.

The inventive integrated circuit 1 also comprises a circuit arrangement 3 for switching from a first operating condition of the integrated circuit 1 to a second operating condition of the integrated circuit 1 differing from the first operating condition. The circuit arrangement 3 for switching comprises an evaluation unit 4 that is connected to the circuit output 2 of the integrated circuit 1 and comprises a control unit 5 that is connected to the evaluation unit 4 and generates at least one control signal dependent on the result of the evaluation unit 4 so that the integrated circuit 1 switches from the first operating condition into the second operating condition. The control unit 5, which is fashioned as a memory in the present example, is connected to the evaluation unit 4 via a first counter 9. A prescribed time span over which the switching condition must be met can be realized with a simple circuit-oriented configuration with the assistance of the counter 9. Also, a further counter 10 is provided that resets the memory 5 after a prescribed time span and thus ends the second operating condition.

In the embodiment shown in FIG. 1, the output signal at the circuit output 2 is output by the activation of a simple open-drain output transistor 6. In normal operation, the open-drain output transistor is wired via a pull-up resistor 11 such that the potential at the drain of the open-drain output transistor 6 lies closer to ground than to the operating voltage when activated. The situation in which the potential at the drain of the open-drain output transistor 6 lies close to the operating voltage despite the activation of the transistor 6 thus represents a case that does not occur during normal operation. The integrated circuit 1 shown in FIG. 1 also comprises a circuit 7 for limiting the control voltage for the open-drain output transistor 6 as well as a protective resistor 8 between the drain of the open-drain output transistor 6 and the circuit output 2.

At the beginning of the inventive method, the integrated circuit 1 is placed into the first operating condition. In this operating condition, the open-drain output transistor 6 is driven and, thus, the potential at the drain of the open-drain output transistor 6 lies closer to ground than to the operating voltage. Accordingly, a low level is generated at the circuit output 2. When the user then wishes to switch the integrated circuit 1 into the second operating condition, he externally applies the circuit output to a high level. This is indicated in FIG. 1 in that the user connects the circuit output 2 to the supply potential by closing the switch 12.

The evaluation unit 4 (which, in the present example, is fashioned as a simple AND gate that is connected both to the circuit output 2 as well as to the control input of the open-drain output transistor 6) then queries the condition that the open-drain output transistor 6 is driven and that the voltage at the circuit output 2 also lies close to the operating voltage and derives the switching information from this. An XOR operation between the logical value that corresponds to the voltage adjacent at the circuit output 2 and the logical value that corresponds to the prescribed output voltage is thereby achieved using the AND gate, which is connected both to the circuit output 2 as well as to the control input of the open-drain output transistor 6.

The current can be limited so that the open-drain output transistor 6 is not destroyed by an excessively high current flux during this special mode; this limiting is also possible in several ways. Possibilities include, for example, limiting or regulating the drive voltage, corresponding dimensioning of the transistor, as well as providing protective resistor 8 in the current path, as shown in FIG. 1.

The evaluation unit 4 thus gets the control voltage of the transistor 6 and the output voltage directly as an input signal and forwards the result of the AND operation to the counter 9. Controlled by an oscillator (not shown), the counter forwards a set signal to the control unit 5 after a certain time span during which the switching condition exists, this control unit 5 then generating a control signal so that the integrated circuit switches from the first operating condition into the second operating condition. The counter 9 controlled by the oscillator thus forms a time counter.

At the same time, the counter 9 starts the counter 10 so that—following another prescribed time span—the counter 10 resets the control unit 5 with a reset signal such that the second operating condition can be ended.

Second Embodiment

FIG. 2 shows a second embodiment of the inventive integrated circuit. This second embodiment of the inventive integrated circuit corresponds to the first embodiment of the inventive integrated circuit as described above, except for the following differences.

In this second embodiment, the first operating condition is designed such that a high level is generated at the circuit output 2 as an output signal. Accordingly, the open-drain output transistor 6 is inhibited. Instead of comprising an AND gate, this embodiment comprises a NOR gate as an evaluation unit 4.

When the user wishes to switch the integrated circuit 1 into the second operating condition, a low level is externally applied to the circuit output 2. This is indicated in FIG. 2 in that the user connects to circuit output 2 to ground by closing the switch 12. The evaluation unit 4 now queries the condition that the open-drain output transistor 6 is inhibited and that the voltage at the circuit output 2 lies close to ground and derives the switching information from this. A NOR operation between the logical value that corresponds to the voltage adjacent at the circuit output 2 and the logical value that corresponds to the prescribed output voltage is achieved by the NOR gate, which is connected both to the circuit output 2 as well as to the control input of the open-drain output transistor 6.

Third Embodiment

FIG. 3 shows a further embodiment of the inventive integrated circuit. This third embodiment of the inventive integrated circuit corresponds to the first embodiment of the inventive integrated circuit described above, except for the following differences.

Instead of the counter 10, the embodiment of the integrated circuit shown in FIG. 3 has a monitoring unit 14. The monitoring unit 14 serves the purpose of checking at least one criterion on whose basis a decision is made as to whether the integrated circuit is reset into the first operating condition or is placed into a further operating condition. For example, the integrated circuit can in turn be reset after the application of the operating voltage. Further possibilities include introducing a separate reset command or to utilize other, inherently forbidden conditions such as over-voltages and under-voltages for this.

The inventive method or the inventive integrated circuit have the advantage that the switching from one operating condition into another operating condition of the integrated circuit can be implemented in a very simple way but with a high immunity to interference. The switching can be very easily initiated as needed because the only thing needed is the application of a voltage level—which is already available in the system—to an output of the integrated circuit. Furthermore, the selection of a circuit output assures that there is a high certainty that the switching condition will not accidentally occur because this is largely precluded by the standard and usually prescribed external interconnection of a circuit output. At the same time, the evaluation of the voltage adjacent at the circuit output can be implemented largely low-power or power-free with a relatively simple circuit-oriented mechanism.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Furthermore, the present invention could employ any number of conventional techniques for electronics configuration, signal processing and/or control, data processing and the like.

The particular implementations shown and described herein are illustrative examples of the invention and are not intended to otherwise limit the scope of the invention in any way. For the sake of brevity, conventional electronics, control systems, and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

What is claimed is:

1. A method for switching from a first operating condition of an integrated circuit to a second operating condition of the integrated circuit differing from the first operating condition, comprising:

generating, by the integrated circuit, a prescribed output voltage as an output signal at least in the first operating condition at at least one circuit output;

placing the integrated circuit into the first operating condition;

externally applying a voltage to the circuit output that differs from the prescribed output voltage;

evaluating the voltage at the circuit output; and placing the integrated circuit into the second operating condition dependent on the evaluation of the voltage.

2. The method according to claim 1, wherein the prescribed output voltage corresponds to a logical value and the voltage externally applied to the circuit output corresponds to no logical value.

3. The method according to claim 1, wherein the prescribed output voltage corresponds to a logical value and the voltage externally applied to the circuit output corresponds to an other logical value complementary to the logical value.

4. The method according to claim 3, further comprising:

performing an evaluation of the voltage adjacent at the circuit output by a logical operation with the logical value that corresponds to the voltage adjacent at the circuit output and the logical value that corresponds to the prescribed output voltage.

5. A method according to claim 4, wherein the logical operation is selected from the group consisting of an XOR operation and a NOR operation.

6. A method according to claim 1, further comprising:

placing the integrated circuit into the second operating condition when the voltage at the circuit output does not coincide with the prescribed output voltage over a prescribed time span.

7. The method according to claim 1, further comprising:

placing the integrated circuit back into the first operating condition when at least one prescribed criterion is met.

8. An integrated circuit comprising a circuit arrangement for switching from a first operating condition of the integrated circuit to a second operating condition of the integrated circuit differing from said first operating condition, the circuit arrangement comprising:

a circuit output at which the integrated circuit is configured to generate a prescribed output voltage as an output signal at least in a first operating condition;

an evaluation unit that is connected to the circuit output configured to produce a result;

a control unit that is connected to the evaluation unit and is configured to generate at least one control signal dependent on the result of the evaluation unit such that the integrated circuit switches from the first operating condition into the second operating condition.

9. The integrated circuit according to claim 8, wherein the evaluation unit comprises a logic circuit.

10. The integrated circuit according to claim 9, wherein the evaluation unit further comprises an AND or a NOR circuit.

11. The integrated circuit according to claim 8, wherein the control unit comprises a memory configured to store an evaluation.

12. The integrated circuit according claim 8, further comprising a time-counter unit configured to prevent switching for a period of time, the time-counter unit being connected with the control unit.

13. The integrated circuit according to claim 8, further comprising a monitoring unit configured to determine an operating condition of the integrated circuit.

* * * * *